United States Patent
Qiu et al.

(10) Patent No.: US 7,348,843 B1
(45) Date of Patent: Mar. 25, 2008

(54) PREDISTORTION LINEARIZER USING CASCADED LOWER-ORDER LINEARIZERS

(75) Inventors: Joe X Qiu, Silver Spring, MD (US); David K Abe, Silver Spring, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 11/416,512

(22) Filed: Apr. 21, 2006

Related U.S. Application Data

(60) Provisional application No. 60/673,343, filed on Apr. 21, 2005.

(51) Int. Cl.
*H03F 1/26* (2006.01)
(52) U.S. Cl. .................. 330/149; 330/151; 455/63.1
(58) Field of Classification Search ............. 330/149, 330/151; 455/63.1
See application file for complete search history.

(56) References Cited

U.S. PATENT DOCUMENTS

| | | | | |
|---|---|---|---|---|
| 4,870,371 A | * | 9/1989 | Gottwald et al. | 330/149 |
| 5,812,294 A | * | 9/1998 | Wilson | 398/194 |
| 5,850,305 A | * | 12/1998 | Pidgeon | 398/193 |
| 6,346,853 B1 | * | 2/2002 | Kangaslahti et al. | 330/149 |
| 6,549,067 B1 | * | 4/2003 | Kenington | 330/52 |
| 7,196,576 B2 | * | 3/2007 | Mizuta et al. | 330/52 |

OTHER PUBLICATIONS

S.C. Cripps, *Advanced Techniques in RF Power Amplifier Design*, Artech House (Norwood, MA) Chapter 5, pp. 179-187 (2002).
R.D. Tupynamba and E. Camargo, "MESFET Nonlinearties Applied to Predistortion Linearizer Design," *IEEE MTT-S Digest*, pp. 955-958 (1992).

* cited by examiner

*Primary Examiner*—Patricia Nguyen
(74) *Attorney, Agent, or Firm*—John J. Karasek; L. George Legg

(57) ABSTRACT

A predistortion linearizer for predistorting a radiofrequency (RF) signal includes a first third-order predistortion linearizer having an input for receiving the RF signal, and a second third-order predistortion linearizer connected in cascade with the first linearizer, whereby fifth order nonlinearities are introduced into a cascaded, predistorted RF output signal. Cascading additional third-order linearizers similarly provides higher-order linearizers.

15 Claims, 15 Drawing Sheets

PREDISTORTION LINEARIZER USING CASCADED LOWER-ORDER LINEARIZERS

CROSS-REFERENCE TO RELATED APPLICATIONS

This Application is a Non-Prov of Prov (35 USC 119(e)) application 60/673,343 filed on Apr. 21, 2005.

TECHNICAL FIELD

The present invention relates to a method and apparatus for predistortion linearization. More particularly, the present invention relates to a higher-order predistortion linearizer using cascaded third-order linearizers.

BACKGROUND OF THE INVENTION

The growing use of multiple-carrier, complex (multi-level, multi-phase), spectrally efficient waveforms such as quadrature-amplitude-modulation (QAM) and code division multiple access (CDMA) in communication systems is placing a growing demand on the power efficiency and linearity of microwave power amplifiers. Continuing reliance on vacuum electronics amplifiers such as traveling-wave tube amplifiers (TWTA) in space-based transponders and ground terminals requires tube designers to constantly develop new techniques to improve the efficiency and linearity of the device. TWTA linearity can be greatly improved by operating the amplifiers with large output power backoff (O.B.O.) from saturation. However, this improvement in linearity is achieved at the expense of the power output and efficiency of the amplifiers. One approach to alleviate the efficiency problem is to optimize the design of the depressed collector to recover the spent beam energy for backoff operation.

To satisfy performance requirements, however, the increasing trend is for power amplifier designers as well as system designers to incorporate pre- or post-linearization modules with the power amplifiers (solid-state or TWTA) to improve overall system efficiency and linearity. There are three basic forms of linearization techniques: feedback, feedforward and predistortion. Feedback has been widely used in audio amplifiers but is of very limited use in microwave frequencies because of its bandwidth limitation due to electrical delays and possible instability problems. Feedforward is a very effective linearization technique for applications requiring both broad bandwidth and high linearity. It is relatively more complex and its effectiveness begins to deteriorate for applications with very high output power and low O.B.O. from saturation. This is primarily due to the increasing power demand on the error amplifier. Signal predistortion is a very simple and efficient linearization technique that has been used successfully for both solid-state power amplifiers (SSPA) and TWTAs. It involves cascading a predistorter in front of the power amplifier. The nonlinear characteristic of the predistorter is complementary to the distortion characteristic of the power amplifiers so that the combined system has little or no distortion. Predistortion can be implemented at the operating microwave frequency, at a convenient intermediate frequency, or at the baseband frequency. The latter option has become an increasingly attractive alternative, in part driven by the advent of high-speed digital-signal-processing circuits and digital-to-analog converters.

By far, the analog predistortion linearizer utilizing a third-order nonlinearity is the most commonly used type of predistortion implementation. The nonlinearity is usually realized with two anti-parallel diodes, a FET channel, or a low-power solid-state amplifier driven into compression, in the manner described in S.C. Cripps, *Advanced Techniques in RF Power Amplifier Design*, Norwood, MA: Artech House, 2002, and in R.D. Tupynamba and E. Camargo, "MESFET Nonlinearties Applied to Predistortion Linearizer Design," IEEE MTT-S Digest, pp. 955-958, 1992, and incorporated herein by reference. Third-order linearizers are reasonably effective at suppressing nonlinear distortion for low- to medium-levels of input drive power. For drive levels close to saturation, however, a higher-order nonlinearity is necessary for effective linearization. Predistortion linearizers that utilize "curve-fitting" of the amplifier distortion characteristic during circuit design have been used to compensate higher-order distortion but such an approach is inherently dependent on the particular amplifier for which the linearizer is designed. Predistortion linearizers with individually adjustable coefficients up to fifth-order are described in the literature but are considerably more complex than third-order linearizers and are subsequently more difficult to fabricate. Furthermore, it is prohibitively difficult to extend such a configuration much beyond a fifth-order implementation.

BRIEF SUMMARY OF THE INVENTION

According to the invention, a predistortion linearizer for predistorting a radiofrequency (RF) signal includes a first third-order predistortion linearizer having an input for receiving the RF signal, and a second third-order predistortion linearizer connected in cascade with the first linearizer, whereby fifth-order nonlinearities are introduced into a cascaded, predistorted RF output signal.

The invention improves the linearity and efficiency of microwave power amplifiers including both traveling-wave tube amplifiers (TWTAs) and solid-sate power amplifiers (SSPAs). The technique can be used as an efficient higher-order nonlinearity generator for predistortion linearization applications in microwave power amplifiers or any other applications where higher-order nonlinearities are desired. It has the advantage of being much simpler and easier to realize than a conventional linearizer at the same correction order and yet provides similar performance.

For a traditional third-order linearizer, the number of power dividing and combining elements is 4; for fifth-, seventh- and ninth-order linearizers, this number is 10, 18 and 28, respectively, with the number of elements scaling roughly as the square of the order of the linearizer. For this invention, this number grows linearly with the order of the linearizer and is respectively 8, 12 and 16 for fifth-, seventh- and ninth-order linearizer implementations. Furthermore, the complexity of constructing higher-order linearizers through cascaded third-order linearizers is on the same order as constructing a single third-order linearizer. The use of third-order modules has the advantage of being simpler to implement in hardware and, in principle, the cascading technique is readily extensible to the implementation of arbitrarily higher-order linearizers.

DETAILED DESCRIPTION OF THE INVENTION

Figure 1A:
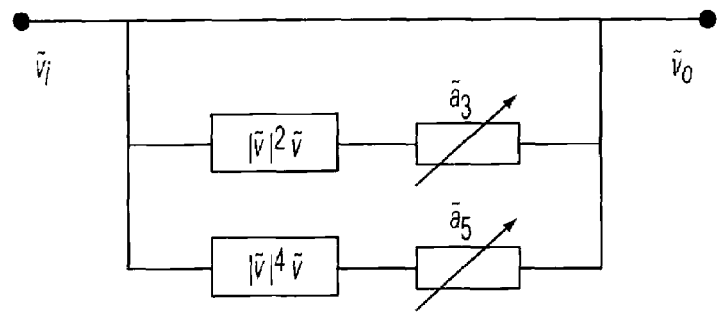
FIG. 1a is a schematic block diagram illustrating a predistortion linearizer with both third- and fifth-order nonlinearities.

A baseband block model for a predistortion linearizer with both third- and fifth-order nonlinearities is shown in FIG. 1a. The output of the linearizer is given by, $$\tilde{v}_o = \tilde{v}_i + \tilde{a}_3 |\tilde{v}_i|^2 \tilde{v}_i + \tilde{a}_5 |\tilde{v}_i|^4 \tilde{v}_i \quad (4)$$

where $\tilde{v}_i$ and $\tilde{v}_o$ are complex input and output voltages, respectively, and $\tilde{a}_3$ and $\tilde{a}_5$ are the respective complex nonlinear coefficients. We note that a third-order linearizer can be realized with just the third-order term alone or it may also include the fifth-order terms. In the latter case, however, the fifth-order coefficient cannot be adjusted independent of the third-order coefficient. In the following discussions, we will assume for simplicity that a third-order linearizer is comprised of only the third-order term. A fifth-order linearizer can adjust both its third- and fifth-order coefficients independently.

Figure 1B:
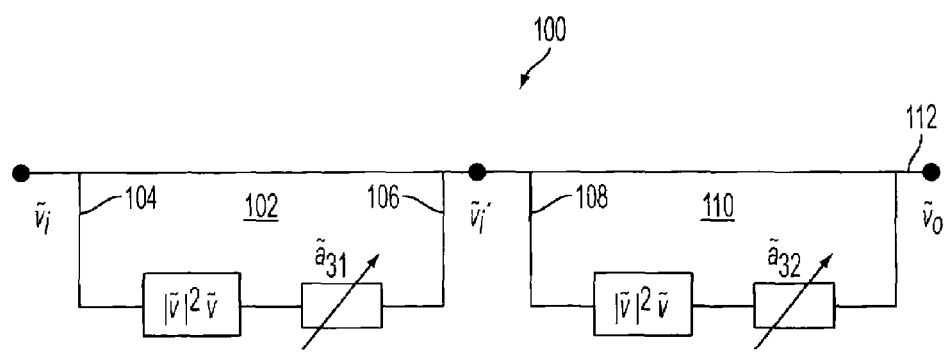
FIG. 1b is a schematic block diagram illustrating a two-cascaded predistortion linearizer according to the invention.

Referring now to FIG. 1b, a predistortion linearizer 100 includes a first third-order predistortion linearizer 102 having an input 104 for receiving an RF signal and an output 106 coupled to an input 108 of a second third-order predistortion linearizer 110; linearizers 102 and 110 are therefore connected in a cascade configuration. Linearizer 102 introduces third-order nonlinearities into the RF signal, which is input to linearizer 110, the output 112 of which is $\tilde{v}_o$ and then includes both third and fifth-order nonlinearities introduced by linearizer 110. It can be shown that the input and output relationship for this configuration is given by, $$\tilde{v}_o = \tilde{v}_i + (\tilde{a}_{31} + \tilde{a}_{32}) |\tilde{v}_i|^2 \tilde{v}_i + \tilde{a}_{32}(2\tilde{a}_{31} + \tilde{a}_{31}^*) |\tilde{v}_i|^4 \tilde{v}_i + \text{higher order terms} \quad (2)$$

where $\tilde{a}_{31}$ and $\tilde{a}_{32}$ are the third-order nonlinear coefficients. The appropriate amplitudes and phases of the third- and fifth-order components can be obtained by simultaneously adjusting $\tilde{a}_{31}$ and $\tilde{a}_{32}$. To realize functions with nonlinearities higher than fifth-order, three or more such third-order linearizers can be cascaded. In a hardware implementation of cascaded third-order linearizers, filters are preferably placed between linearizers to filter out higher-order harmonics.

Experimental Description

A vector signal generator (VSG) uses precision high-speed digital-to-analog converters (DACs) to accurately reproduce an RF waveform and can simultaneously modulate the amplitude and phase of the waveform; a vector signal analyzer (VSA) uses high-speed analog-to-digital converters to capture a time-segment of an RF waveform and provides information on both the instantaneous amplitude and phase of the waveform. Both VSG and VSA are primarily time-domain instruments, but they can also be used to provide frequency-domain information. The frequency-domain information of a particular waveform captured by a VSA can be recovered by performing fast-Fourier-transform (FFT) on the time samples of the digitized waveform.

For all of the measurements described here, an Agilent E4438C VSG was used to generate the input waveforms for testing the TWTs and an Agilent 89610 VSA was used to sample and analyze the output of the TWTAs. The test waveforms included single-tone, two-tone and digitally modulated waveforms. Both the Agilent VSG and VSA cover the frequency range up to 6 GHz. For frequencies higher than 6 GHz, up- and down-conversion mixers were used to up-shift the center frequency of the waveform to the operating band of the TWT and to down-shift the frequency of the TWT output for analysis by the VSA. All conversion mixers were ensured to operate linearly and without compression. Appropriate linear pre-amplifier drivers were placed after the up-conversion mixers to provide enough power to saturate the TWTs. Predistortion linearization was implemented by applying Eq. (1) or (2) to the waveform data before it was downloaded to the VSG.

Five TWTs covering L, C, Ku and Ka-band frequencies were used for testing. They are the following:

1. L-band: Hughes 8537H helix TWT, 80 W, 1.53-1.65 GHz.
2. C-band: (a) NRL/NG helix TWT, 140 W, 4-6 GHz; (b) Varian VZC6961K1 helix TWT, 40 W, 4-8 GHz.
3. Ku-band: CPI VTU-6397 helix TWT, 13-14.75 GHz, 600 W.
4. Ka-band: CPI VTA-6430 Coupled-Cavity TWT, 28-30 GHz, 500 W.

Of the five TWTs, experimental data from Tubes 1 and 3 have been compared with a helix TWT design code (CHRISTINE) and have shown good agreement with the models; Tube 4 was designed and fabricated using a coupled-cavity TWT code (GATOR); and Tube 2a was designed using CHRISTINE. The circuit parameters for Tube 2a were optimized for best linearity using as optimization feature in CHRISTINE. For all the measurements, one carrier frequency was selected for testing in each band: 1.65 GHz (L-band), 5.25 GHz (C-band), 13.75 GHz (Ku-band) and 29.0 GHz (Ka-band).

Analysis of Experimental Data

Depending on the drive signal, different metrics can be used to evaluate the performance of the TWT or the combined module of linearizer and TWT. In this section, three different types of input waveforms (unmodulated-single-tone, two-tone and digitally modulated waveforms) are used and the response of the TWTs to each of these waveforms is analyzed.

For measurements using two-tone and digitally modulated waveforms, the power level of a particular output waveform is characterized by its time-domain peak power backed-off from the saturation output power of the unmodulated-single-tone waveform. In most of the literature, however, the power level of a waveform is more commonly characterized by its average power backed-off from the saturation output power of the unmodulated-single-tone waveform. The peak power and average power of a waveform are related by its peak-to-average-ratio (PAR) which is dependent on the statistics of the waveform. For example, the PAR of a two-tone waveform is equal to 3 dB.

For all measurements, the output power level at "near saturation" is defined as O.B.O.=0.05 dB. The reason for choosing a finite small number instead of O.B.O.=0 is to avoid the sharp limiter characteristic of the amplifiers at saturation when predistortion linearization is applied. This sharp limiter characteristic can cause the performance metrics of the amplifiers (gain compression, spectral regrowth, etc.) to change drastically with very large slope at saturation. The choice of O.B.O.=0.05 dB is somewhat arbitrary and is not critical as long as the sharp limiter transition region at saturation can be avoided.

A. Single-Tone Measurements

A single-tone input signal has been the most commonly used waveform for characterizing the performance of TWTAs. Metrics related to single-tone waveforms include nonlinear gain (AM-AM) and amplitude-to-phase conversion (AM-PM) transfer curves. Another commonly used metric is 1-dB gain compression point. The use of this metric could be problematic because, as we will see later, for higher-order linearization, the gain compression at saturation could be less than 1 dB. Instead, we will concentrate on the gain compression at near saturation.

Figure 2A:
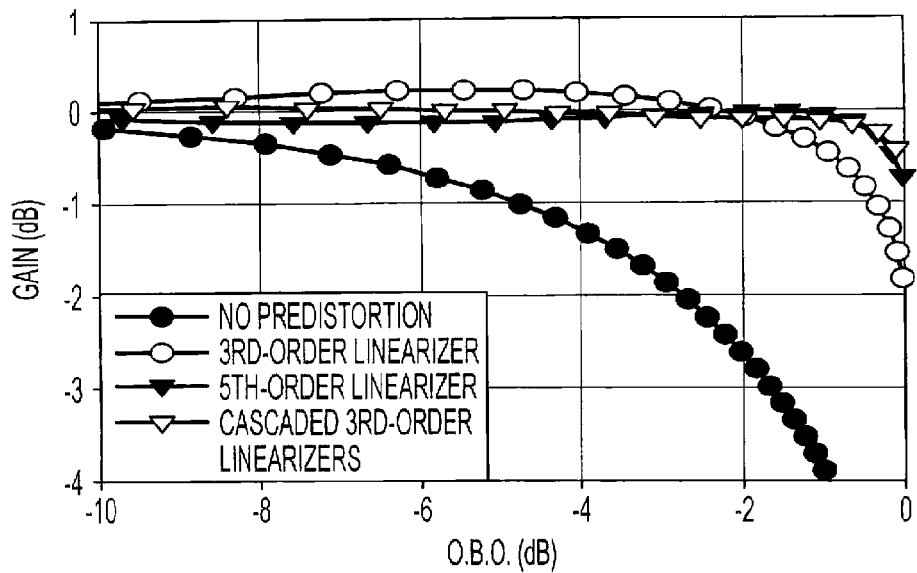
FIG. 2 shows the results using a C-band traveling-wave tube amplifier (TWTA) in accordance with the invention.
Figure 2B:
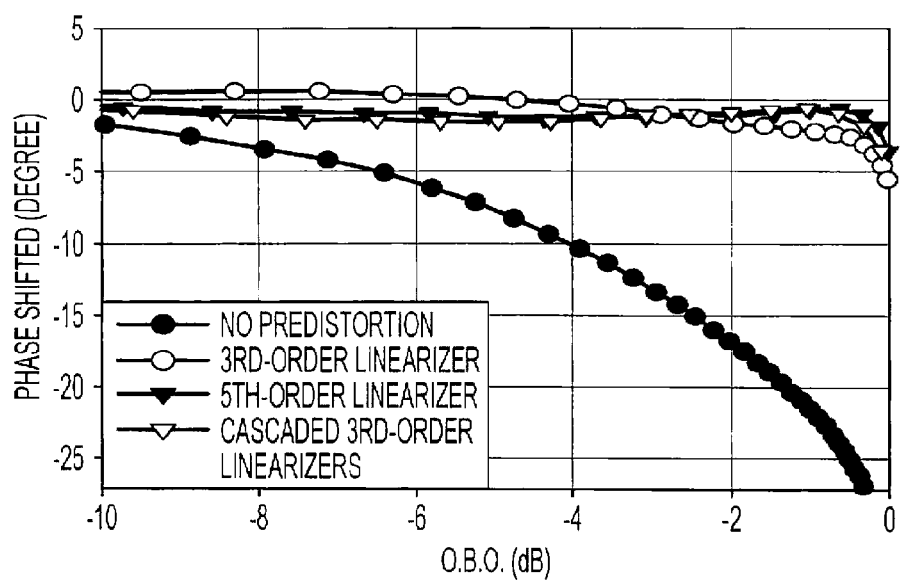
Figure 3:
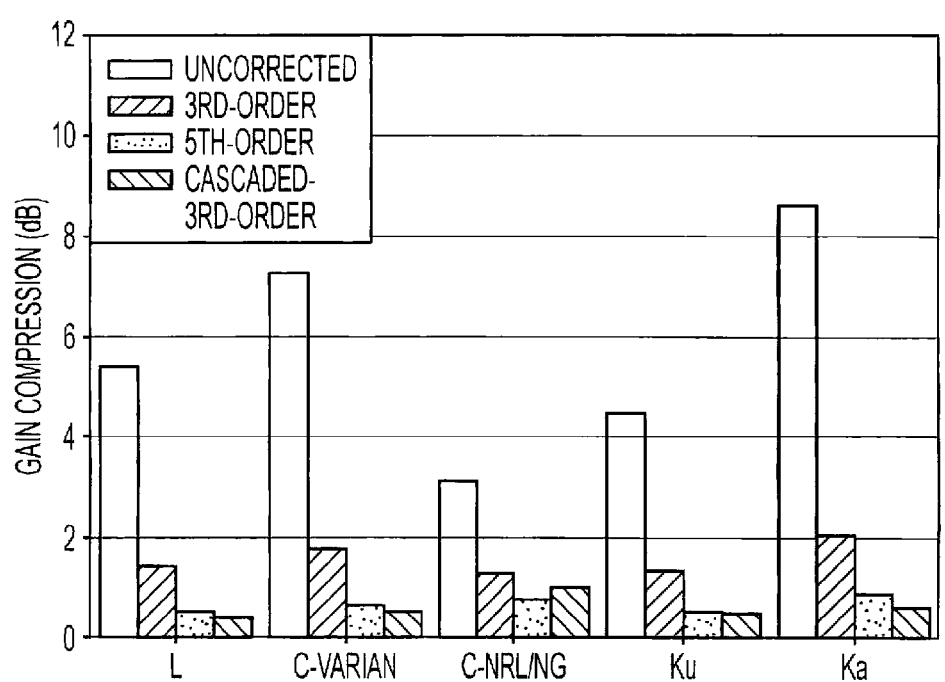
FIG. 3 shows the gain compression at near saturation for five TWTAs in accordance with the invention.

In order to measure the transfer curves of the TWTA, the input power to the TWTA was varied in increasing steps. Four different classes of input waveforms were studied: (i) linear [no predistortion—$\tilde{a}_3=\tilde{a}_5=0$ in (1)]; (ii) third-order predistortion function [$\tilde{a}_3\approx 0$, $\tilde{a}_5=0$ in (1)]; (iii) fifth-order predistortion functions [$\tilde{a}3\approx 0$ and $\tilde{a}_{5\_}0$ in (1)]; and (iv) two cascaded third-order predistortion functions [$\tilde{a}_{31}0$ and $\tilde{a}_{32}\approx 0$ in (2)]. The waveform in (i) was used to measure the intrinsic input-output response (AM-AM and AM-PM) of the TWTA. The nonlinear coefficients in (ii), (iii) and (iv) were adjusted to minimize the least-square sum of the differences between the TWTA output and the ideal linear step output. All the steps in each of the input waveform were also sufficiently long so that transient effects were not an issue. The results for the Varian C-band VZC6961K1 helix TWT (Tube 2b) are shown in FIG. 2. The improvement in gain compression and phase shift through the use of linearization, in general, and the further improvement by fifth-order relative to third-order linearization are clearly demonstrated. The gain compression at near saturation is less than 1 dB for both fifth-order and cascaded third-order functions as compared to approximately 1.8 dB for the third-order function alone. Also note that there is almost no difference in performance between the fifth-order and the cascaded third-order linearization functions—a clear indication that the cascaded third-order nonlinearity implementation can function as an efficient fifth-order nonlinearity generator. Another interesting observation is that all three linearization schemes provide similar phase correction; the phase corrections provided by the three schemes differ by only a few degrees. In FIG. 3, we summarize the gain compression at near saturation for all five TWTs. All five TWTs show continuous improvement in gain compression as the linearization order is increased up to five. The improvement from third-order to fifth-order for the NRL/NG C-band TWT is more moderate relative to the other four TWTs. This will be discussed further below.

B. Two-Tone Measurements

Figure 4A:
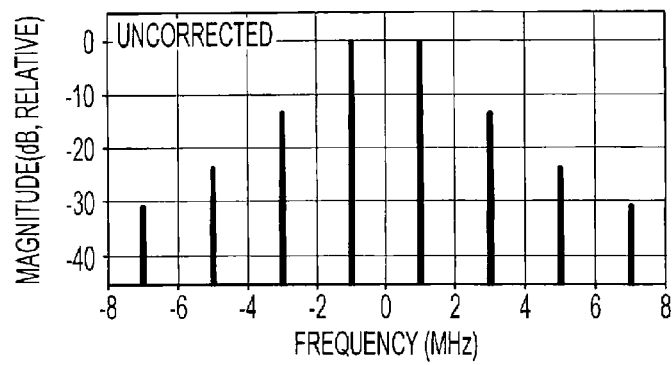
FIG. 4a shows a typical measured two-tone spectrum from a TWT (Varian C-band) showing Intermodulation Products (IPs) production.
Figure 4B:
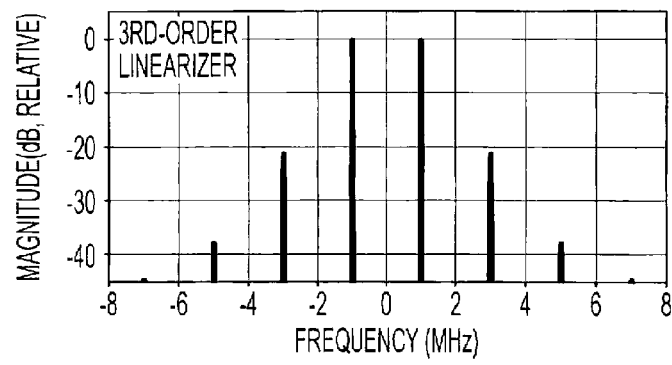
FIGS. 4b-d respectively show the measured output spectra from the same TWT when the input two-tone waveform was predistorted using third-order, pure fifth-order and cascaded third-order nonlinear functions.
Figure 4C:
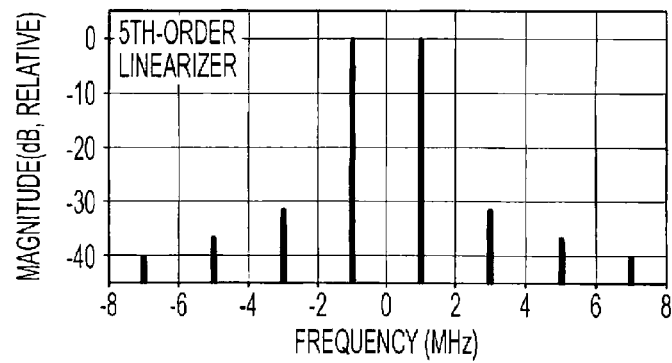
Figure 4D:
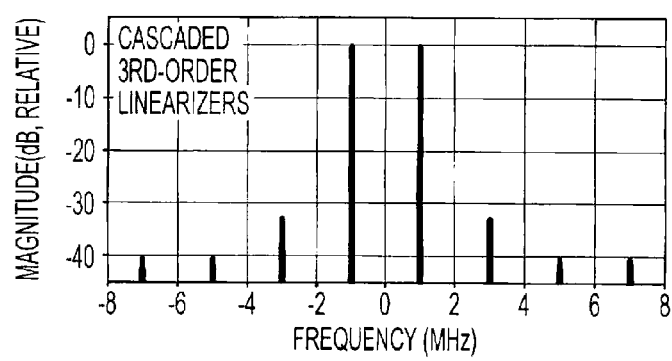

When waveforms containing two carrier frequencies $f_1$ and $f_2(f_2>f_1, \Delta f=f_2-f_1)$ are amplified by a TWT, because of the presence of nonlinearities, intermodulation-products (IPs) are produced at frequencies offset from the carriers by multiples of the frequency separation of the carriers. A particular order of nonlinearity can only produce IPs of order equal to or lower than the order of the nonlinearity. For example, the third-order nonlinear component in the TWT amplification process can only produce third-order IPs ($f_1-\Delta_f$ and $f_2+\Delta_f$) and the fifth-order nonlinear component can produce third-order IPs as well as fifth-order IPs ($f_1-2\Delta f$ and $f_2+2\Delta f$). Similarly, higher-order IPs can be produced through higher-order nonlinearities. A typical measured two-tone spectrum from a TWT (Varian C-band) showing IPs production is shown in FIG. 4a. The peak power for the output waveform corresponding to FIG. 4a was equal to the single-tone near saturation power (~0.05 dB O.B.O). FIGS. 4b, 4c and 4d are the measured output spectra from the same TWT when the input two-tone waveform was predistorted using third-order, pure fifth-order and cascaded third-order nonlinear functions with their nonlinear coefficient set to those obtained from the single-tone measurements. The peak power of the two-tone output waveforms for all three spectra were at single-tone near saturation power. The frequency spacing for the two input tones was kept at 2 MHz for all measurements.

Figure 5A:
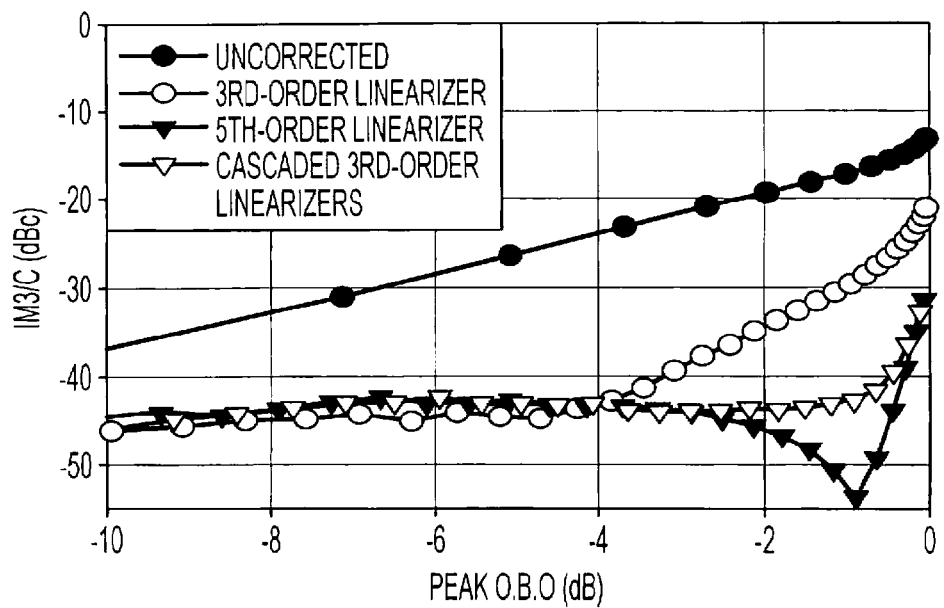
FIG. 5 shows the cancellation of third- and fifth-order IPs at a specific level of input power in accordance with the invention.
Figure 5B:
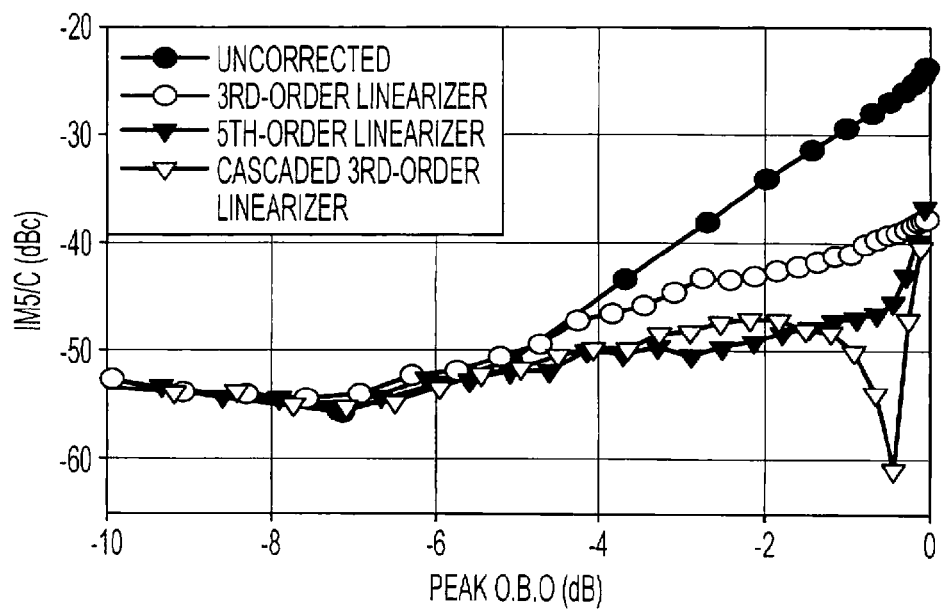
Figure 6:
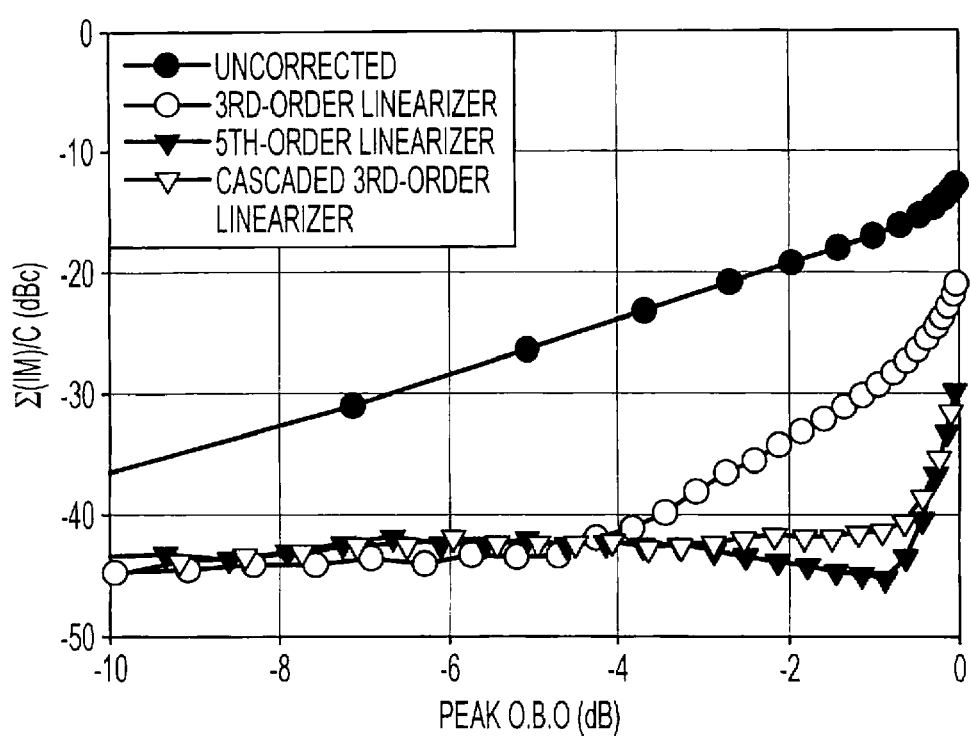
FIG. 6 shows the significant improvement in Σ(IM)/C due to predistortion linearization in accordance with the invention.
Figure 7:
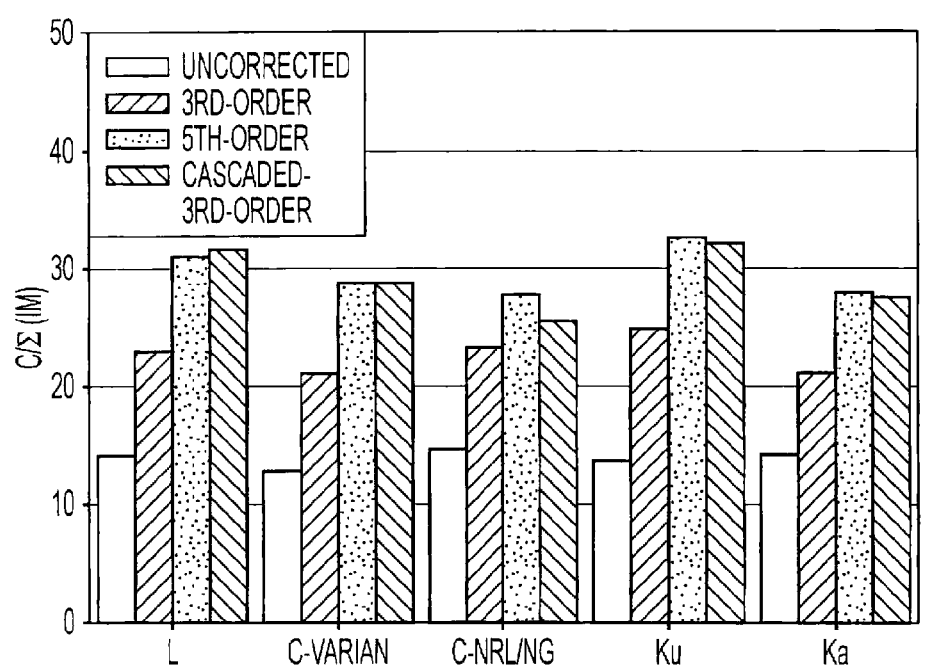
FIG. 7 shows a summary of Σ(IM)/C for five TWTs when the peak output power is equal to single-tone near saturation in accordance with the invention.
Figure 8A:
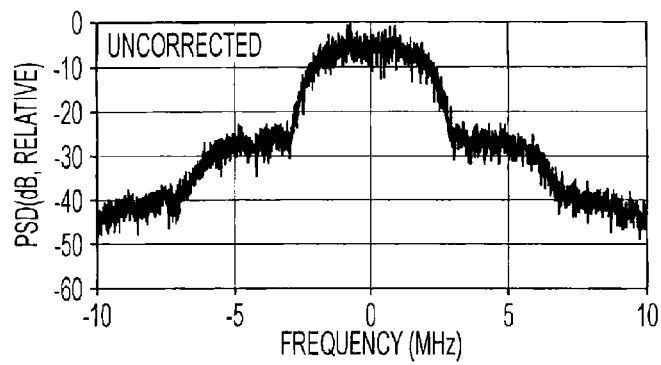
FIG. 8 shows the spectra of 32-QAM waveforms measured at the output of the C-band TWT for un-predistorted, third-order, fifth-order and cascaded third-order predistorted cases.
Figure 8B:
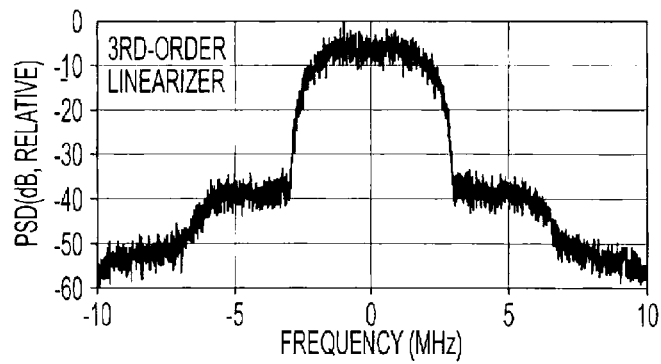
Figure 8C:
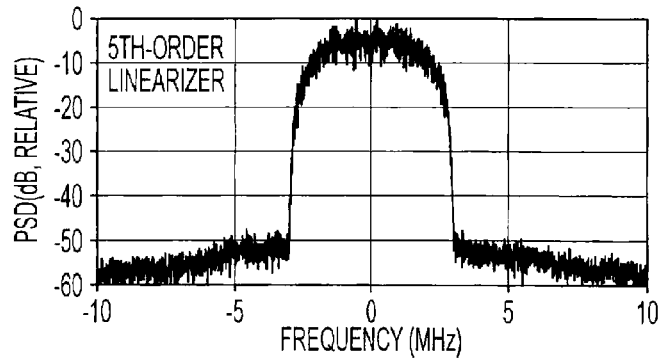
Figure 8D:
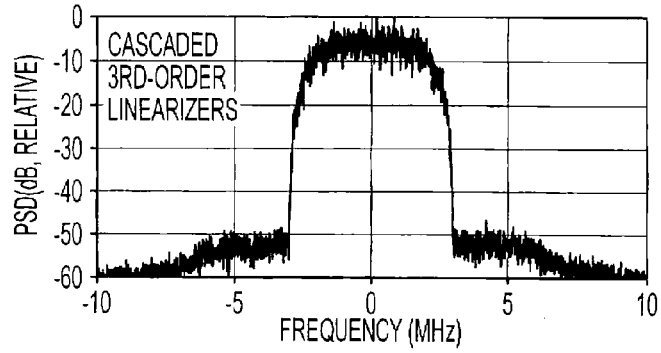

For two-tone input waveforms, the third-order-intermodulation-product-to-carrier-ratio (IM3/C) has been widely used as the performance metric for evaluating the linearity of TWTs and also linearized TWTs. The justification for this practice is that, for most cases, the third-order IPs are more dominant IPs than higher-order IPs, as demonstrated by all four cases in FIG. 4. However, for some cases, this assumption might not be valid. One such case is where the magnitude of higher-order IPs could be comparable to or even greater than that of third-order IPs if linearization is applied. This is particularly probable when fifth- or higher-order linearization techniques are used. The other case is the efficient cancellation of a particular order of IPs at a specific level of input power. Such efficient cancellation would appear as notches in IP plots as shown in FIG. 5. In FIG. 5, there are notches in both the third- and fifth-order IPs. The appearances and locations of these notches depend on the values of the nonlinear coefficients in the predistortion function and ultimately the criteria for setting the values of these coefficients. They do not imply the efficient cancellation of IPs at other input power levels or the cancellation IPs of other orders at the specific power level. The appearance of these notches is a unique phenomenon for two-tone waveforms and they would not occur for more complicated waveforms. They also illustrate the danger of concentrating solely on a particular order of IPs. The effect of IPs of other orders must also be considered for an accurate assessment of linearization effectiveness. The total-intermodulation-product-to-carrier-ratio ($\Sigma(IM)/C$) defined as the ratio of the total power of all IPs to the total carrier power can be used for such purpose. The $\Sigma(IM)/C$ for the Varian C-band TWT is shown in FIG. 6 as a function of output peak power for both un-predistorted and predistorted waveforms. For all input power levels in FIG. 6, the application of predistortion linearization results in significant improvement in $\Sigma(IM)/C$. For O.B.O. greater than 4 dB, there is basically no difference in $\Sigma(IM)/C$ between third-order and the two fifth-order implementations. For O.B.O. less than 4 dB, $\Sigma(IM)/C$ increases rapidly for third-order linearization but remains more or less constant for fifth-order until O.B.O. is roughly 0.5 dB. The advantage of fifth-order linearization is clearly apparent. Fifth-order linearization provides an improvement of about 13 dB relative to third-order linearization at O.B.O.=0.5 dB and retains an approximate 10 dB advantage even at near saturation. FIG. 7 is a summary of $\Sigma(IM)/C$ for all five TWTs when the peak output power is equal to single-tone near saturation. As in the single-tone testing, considerable improvement of total IP power for successive increases of linearization order is observed for all TWTs except for the NRL/NG C-band TWT, which shows much less improvement between third- and fifth-order. The reason for this will be discussed below.

C. Digitally Modulated Signal Measurements

Digital communication systems use advanced digital modulation techniques to increase spectral efficiency, to provide multiple access and to improve reliability and anti-jamming capability. These signals display characteristics that are similar to random noise—a continuous spectral distribution occupying a finite bandwidth in the frequency-domain and a continuous amplitude distribution with large peak-to-average-ratio (PAR) in the time-domain.

The presence of nonlinearities in the transmitter has two effects on the overall system performance: (1) spectral regrowth caused by nonlinear distortion outside of the allocated bandwidth can create interference with neighboring signals; (2) the distortion in waveform can lower the receiver's ability to recover the transmitted information and increase the probability for information error.

To illustrate these two effects, the response of the TWTs to a 32-QAM waveform was studied. The 32-QAM waveform had a symbol rate of 4 Msymbols/s and was filtered by identical matching root-raised-cosine filters with $\alpha$=0.5 in both the signal generator and the signal analyzer. The total bandwidth of the undistorted waveform was therefore 6 MHz and the PAR for the waveform was approximately 5 dB.

In FIG. 8, the spectra of the 32-QAM waveforms measured at the output of the Varian C-band TWT are shown for un-predistorted, third-order, fifth-order and cascaded third-order predistorted cases. The nonlinear coefficients used in the predistortion functions were those obtained from the single-tone characterization. The peak output power was the same for each case (near saturation, 0.05 dB O.B.O.). An indication of spectral regrowth is the presence of pedestals on the sides of the main lobe. The application of predistortion linearization lowers the height of the pedestals and they continuously decrease as the order of linearization is increased. Again, the cascaded third-order predistortion produces almost identical result as the pure fifth-order predistortion.

Adjacent-channel-power-ratio (ACPR) is defined as the ratio of the power in a channel bandwidth next to the main signal channel. It provides a quantitative measure for spectral regrowth due to nonlinear distortion. Because it accounts for the contribution from all of the IPs in a given spectral band, ACPR can be thought of as an extension of $\Sigma(IM)/C$ in two-tone measurement for digitally modulated waveforms. The exact definition of ACPR depends on the modulation format as well as the communication standard employed in the system. For all of the measurements described herein, the adjacent channels were defined as the two 6-MHz bands adjacent to the main frequency channel; no guard bands were inserted between the main channel and the adjacent channels.

Figure 9:
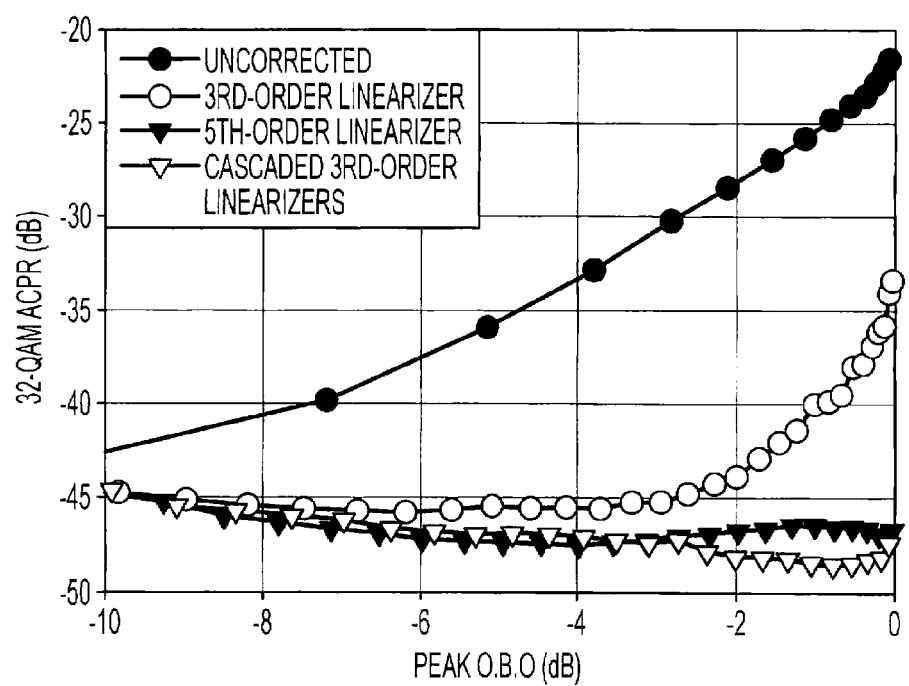
FIG. 9 shows the adjacent-channel-power-ratio (ACPR) for the Varian C-band TWT as a function of output power in accordance with the invention.
Figure 10:
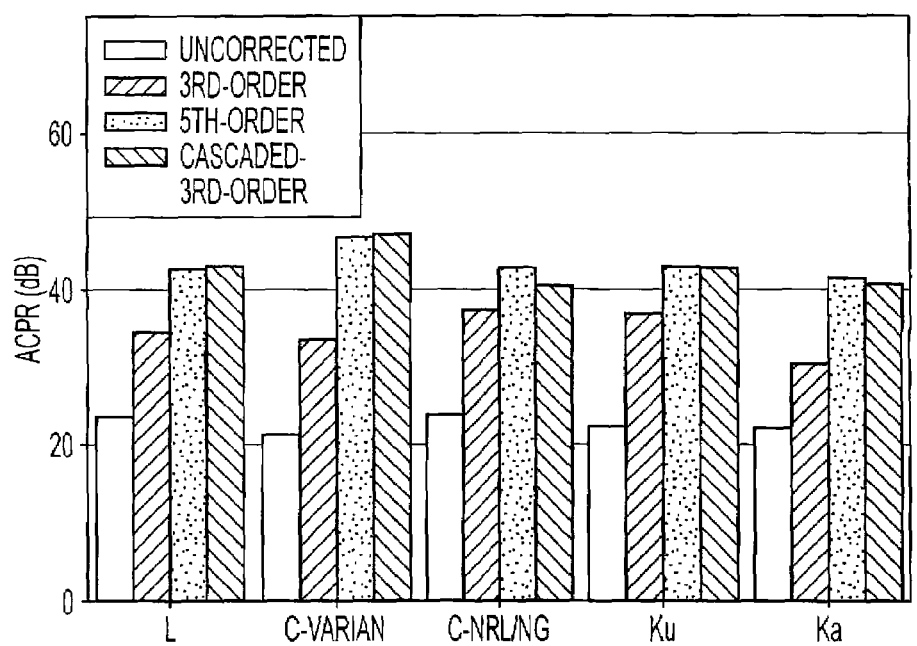
FIG. 10 summarizes the ACPR for the TWTs at near saturation in accordance with the invention.

The ACPR for the Varian C-band TWT as a function of output power is shown in FIG. 9. FIG. 9 shows a very similar trend as FIG. 6. All three predistortion techniques show significant ACPR improvement over the un-predistorted case. At low input drive levels, the three techniques produce similar ACPRs. As drive levels approach saturation (~2 dB O.B.O), however, the two fifth-order implementations show almost no deterioration in ACPR and produce significantly better results while the performance of third-order predistortion declines rapidly. Both the pure fifth-order and cascaded third-order predistorters produce greater than 10 dB improvement in ACPR over the third-order case at near saturation. The ACPR for all the TWTs at near saturation is summarized in FIG. 10.

Error-vector-magnitude (EVM) is a measure of digital modulation accuracy and defined as root-mean-square value of the difference vectors between the recovered symbols and their associated ideal constellation points for a particular modulation format at the moments of symbol decision. EVM is usually reported as a percentage of the peak symbol level. It provides a simple quantity for describing signal impairment and diagnosing device distortion. It can be directly related to system level figure of merits such as bit-error-rate (BER) if the cause of the EVM is also known.

Figure 11A:
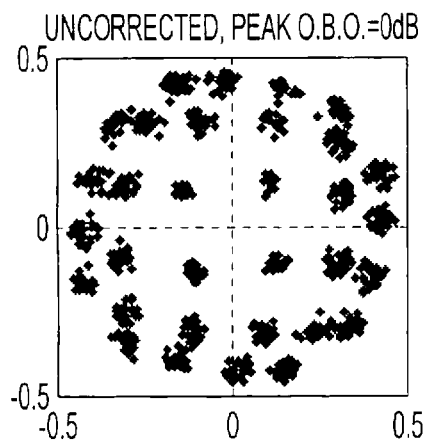
FIG. 11 shows recovered constellation plots for the 32-QAM signals corresponding to the four spectra in FIG. 8.
Figure 11B:
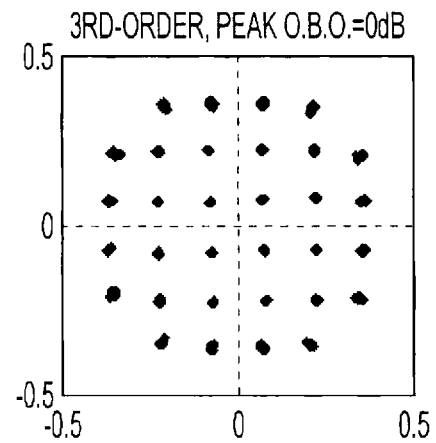
Figure 11C:
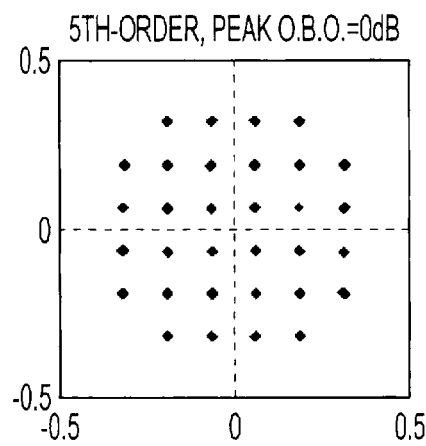
Figure 11D:
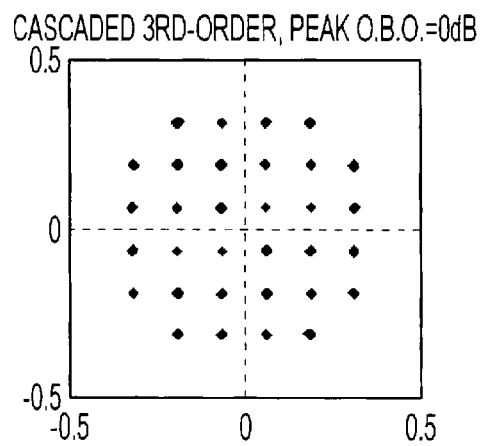
Figure 12:
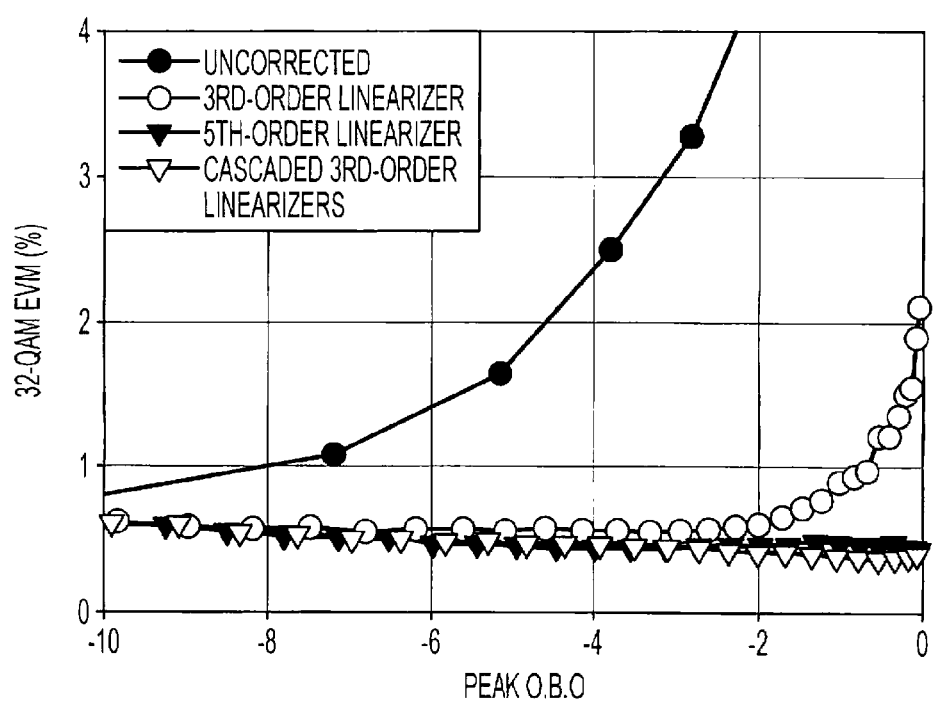
FIG. 12 shows the EVM plotted as the output power is scanned in accordance with the invention.
Figure 13:
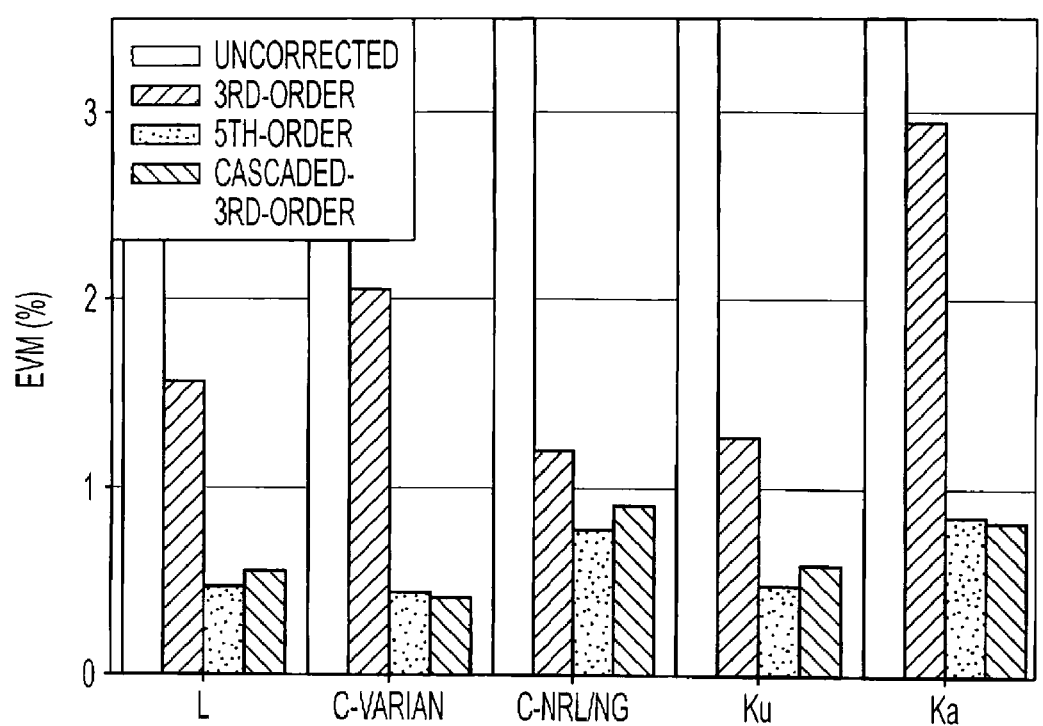
FIG. 13 summarizes EVM for the TWTs at near saturation in accordance with the invention.

The recovered constellation plots for the 32-QAM signals corresponding to the four spectra in FIG. 8 are shown in FIGS. 11a-d. Without any linearization, the nonlinear distortion of the TWT at near saturation causes significant errors for all the recovered symbols and renders the waveform useless for information transmission as illustrated in FIG. 11a. The use of linearization corrects the distortion in the waveform, and therefore greatly increases the receiver's probability in correctly detecting the transmitted symbols (FIG. 11b, c and d) with the fifth-order implementations providing additional improvement over third-order linearization. In FIG. 12, the EVM for the same tube is plotted as the output power is scanned. For third-order linearization, the EVM remains more or less constant until the output power is increased to about 2 dB O.B.O. and it then starts to increase rapidly. With the introduction of fifth-order predistortion, the EVM remains essentially unchanged over the entire available power range of the TWT. The EVM for all the TWTs at near saturation is summarized in FIG. 13.

4. TWT Linearizability and Design Optimization

For a normal TWT without linearization, because of AM-AM and AM-PM nonlinearity, it must operate with considerable output power backoff in order to meet a particular specification requirement. For example, for two-tone drive, in order to keep third-order IPs at a level of 30 dBC, all five TWTs we have tested required significant backoff (peak power O.B.O.): 6.1 dB (L-band), 6.7 dB (C-band-Varian), 5.3 (C-band-NRL/NG), 6.7 dB (Ku-band) and 6.0 dB (Ka-band). If third-order predistortion is introduced, much less O.B.O. (peak power) is required: 0.7 dB (L-band), 1.0 dB (C-band-Varian), 0.32 dB(C-band-NRL/NG), 0.5 dB (Ku-band) and 1.0 dB (Ka-band). If a fifth-order predistortion (either pure fifth-order or cascaded third-order) is used, essentially no peak OBO is needed to satisfy the above requirement.

In general, third-order and fifth-order linearizers have similar performance for large backoff from saturation. For TWT applications, a fifth-order linearizer is superior to a third-order linearizer approaching saturation. The power level at which third- and fifth-order linearization begin to differ depends on the statistics of the input waveforms as well as the transfer curves of the TWTs. In FIG. 6, this power level is about 4 dB (peak O.B.O.) for Σ(IM)/C and in FIGS. 9 and 12, the power level is around 2 dB (peak O.B.O.) for both ACPR and EVM. The lower O.B.O. value for ACPR and EVM can be accounted for by the relatively larger PAR value for the 32-QAM waveform used in the measurement (5 dB for 32-QAM vs. 3 dB for two-tone waveform).

Figure 14A:
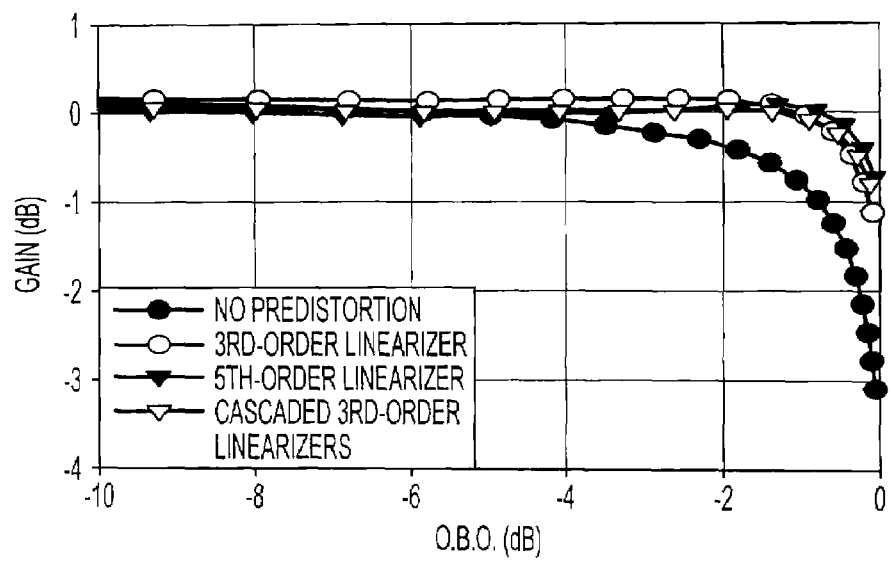
FIG. 14 shows the comparative improvement in drive curves from third-order to fifth-order between TWTs.
Figure 14B:
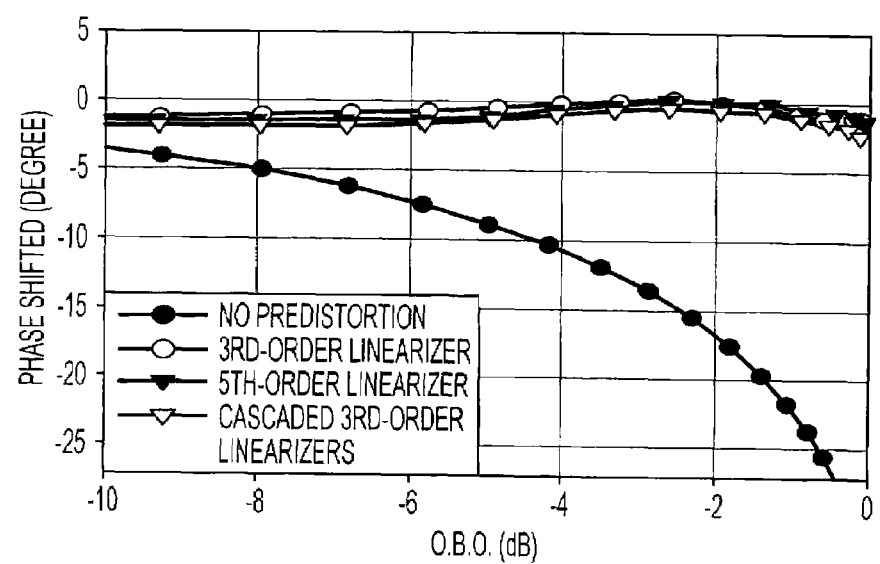
Figure 15:
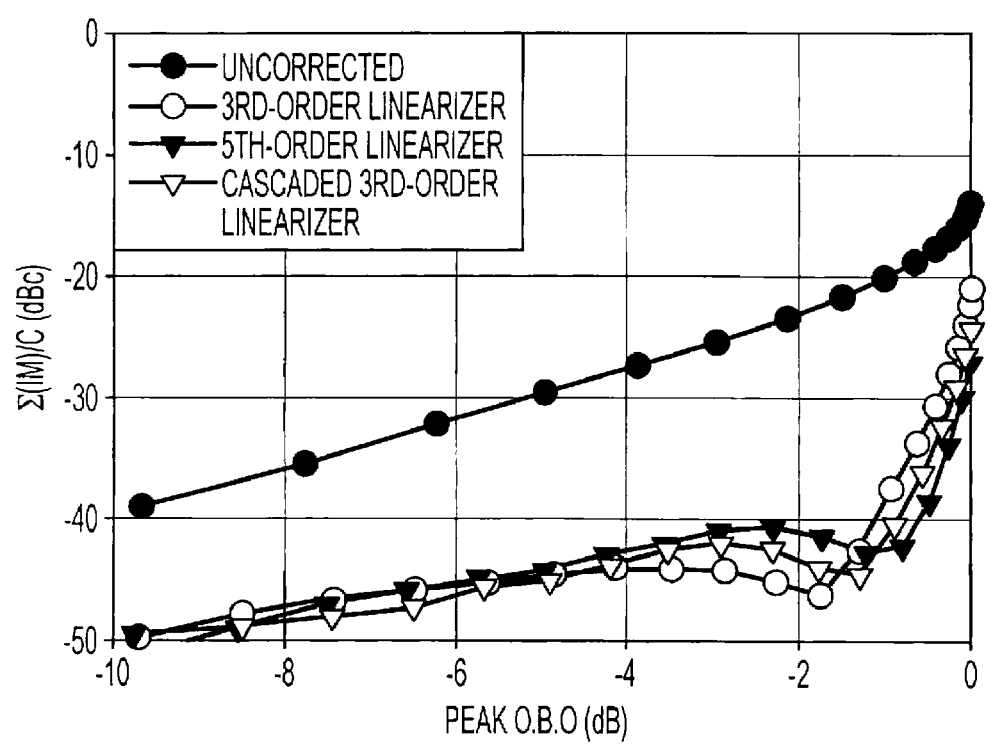
FIG. 15 shows the comparative improvement in (IM)/C from third-order to fifth-order between TWTs.

The additional improvement of fifth-order linearizers over a single third-order linearizer at near saturation is clearly illustrated in FIGS. 3, 6, 10 and 13 for all the test waveforms. This improvement, however, is more moderate for the NRL/NG C-band TWT. The NRL/NG C-band TWT was designed by varying the helix pitch profile to provide the best possible linear complex gain using the optimization feature in CHRISTINE. This improvement is clearly evident by comparing FIG. 14 (drive curves for the NRL/NG C-band TWT) with FIG. 2 (drive curves for the Varian C-band TWT). The NRL/NG TWT has the least gain compression (~3.2 dB) at near saturation among all five TWTs as shown in FIG. 3. The optimization also results in roughly 1 to 1.5 dB improvement in O.B.O. for the example of 30 dBc of C/3IM without predistortion linearization. However, such an improvement can easily be surpassed by the combination of an "un-optimized" TWT with a linearizer of arbitrary order. There the improvement in output power is usually 5 to 6 dB. Furthermore, even though the application of third-order predistortion on the "optimized" TWT achieves the usual performance improvement for all test waveforms as shown in FIGS. 3, 6, 10 and 13, the improvement from third-order to fifth-order for the TWT is noticeably less than the other four TWTs both at near saturation and away from saturation as indicated in FIG. 14 (drive curves) and FIG. 15 (Σ(IM)/C). This suggests the existence of higher-than-fifth-order nonlinearities. The presence of these higher-than-fifth-order nonlinearities limits the effectiveness of fifth-order predistortion and their correction must require higher-than-fifth-order predistortion. This is also a demonstration that, for a TWT to be used together with a linearizer, the optimal design can only be achieved if the performance factors (linearity and efficiency) of the combine module are analyzed.

Obviously many modifications and variations of the present invention are possible in the light of the above teachings. For example, in a radiofrequency-over-fiber link, the intensity of the optical light carrier is modulated by a Mach Zehnder modulator (MZM) driven by RF. The depth of modulation is limited by the nonlinearity of the MZM. By using linearization, the modulation depth can be improved. The cascaded configuration would be able to provide higher-order linearization and even deeper modulation for MZM and RF-over-fiber link. It is therefore to be understood that the scope of the invention should be determined by referring to the following appended claims.

What is claimed as new and desired to be protected by Letters Patent of the United States is:

1. A predistortion linearizer for predistorting a radiofrequency (RF) signal, comprising:
a first third-order predistortion linearizer having an input for receiving the RF signal; and
a second third-order predistortion linearizer connected in cascade with the first third-order predistortion linearizer, whereby fifth-order nonlinearities are introduced into a cascaded, predistorted RF output signal.

2. A predistortion linearizer as in claim 1, wherein the input-output relationship is defined by $$\tilde{v}_o = \tilde{v}_i + (\tilde{a}_{31} + \tilde{a}_{32})|\tilde{v}_i|^2 \tilde{v}_i + \tilde{a}_{32}(2\tilde{a}_{31} + \tilde{a}_{31}^*)|\tilde{v}_i|^4 \tilde{v}_i + \text{higher order terms}$$

where $\tilde{v}_i$ and $\tilde{v}_o$ are complex input and output voltages, respectively, and $\tilde{a}_{31}$ and $\tilde{a}_{32}$ are the respective complex nonlinear coefficients.

3. A predistortion linearizer as in claim 2, wherein amplitudes and phases of the third- and fifth-order components can be obtained by simultaneously adjusting $\tilde{a}_{31}$ and $\tilde{a}_{32}$.

4. A predistortion linearizer as in claim 1, wherein each predistortion linearizer comprises two anti-parallel diodes, a FET channel, or a low-power solid-state amplifier driven into compression.

5. A predistortion linearizer as in claim 1, further comprising a third predistortion linearizer connected in cascade with the second predistortion linearizer.

6. A method for predistorting a radiofrequency (RF) signal, comprising:
receiving an RF signal;
inputting the RF signal to a first third-order predistortion linearizer to generate a first RF output signal having third-order nonlinearities;
inputting the first RF output signal to a second third-order predistortion linearizer connected in cascade with the first third-order predistortion linearizer to generate a second RF output signal having fifth-order nonlinearities; and
applying the second RF output signal to a power amplifier in a communication device.

7. A method as in claim 6, wherein the power amplifier is a microwave power amplifier in a microwave communications system.

8. A method as in claim 6, wherein an input-output relationship is defined by $$\tilde{v}_o = \tilde{v}_i + (\tilde{a}_{31} + \tilde{a}_{32})|\tilde{v}_i|^2 \tilde{v}_i + \tilde{a}_{32}(2\tilde{a}_{31} + \tilde{a}_{31}^*)|\tilde{v}_i|^4 \tilde{v}_i + \text{higher order terms}$$

where $\tilde{v}_i$ and $\tilde{v}_o$ are complex input and output voltages, respectively, and $\tilde{a}_{31}$ and $\tilde{a}_{32}$ are the respective complex nonlinear coefficients.

9. A method as in claim 7, wherein amplitudes and phases of the third- and fifth-order components can be obtained by simultaneously adjusting $\tilde{a}_{31}$ and $\tilde{a}_{32}$.

10. A method as in claim 6, wherein each predistortion linearizer comprises two anti-parallel diodes, a FET channel, or a low-power solid-state amplifier driven into compression.

11. A method for predistorting a radiofrequency (RF) signal, comprising:
receiving an RF signal;
inputting the RF signal to a first third-order predistortion linearizer to generate a first RF output signal having third-order nonlinearities;

inputting the first RF output signal to a second third-order predistortion linearizer connected in cascade with the first third-order predistortion linearizer to generate a second RF output signal having fifth-order nonlinearities; inputting the second RF output signal into a third third-order predistortion linearizer connected in cascade with the second third-order predistortion linearizer to generate a third RF output signal; and applying the third RF output signal to a power amplifier in a communication device.

12. A method as in claim 11, wherein the power amplifier is a microwave power amplifier in a microwave communications system.

13. A method as in claim 11, wherein an input-output relationship is defined by $$\tilde{v}_o = \tilde{v}_i + (\tilde{a}_{31} + \tilde{a}_{32})|\tilde{v}_i|^2 \tilde{v}_i + \tilde{a}_{32}(2\tilde{a}_{31} + \tilde{a}_{31}^*)|\tilde{v}_i|^4 \tilde{v}_i + \text{higher order terms}$$

where $\tilde{v}_i$ and $\tilde{v}_o$ are complex input and output voltages, respectively, and $\tilde{a}_{31}$ and $\tilde{a}_{32}$ are the respective complex nonlinear coefficients.

14. A method as in claim 13, wherein amplitudes and phases of the third- and fifth-order components can be obtained by simultaneously adjusting $\tilde{a}_{31}$ and $\tilde{a}_{32}$.

15. A method as in claim 11, wherein each predistortion linearizer comprises two anti-parallel diodes, a FET channel, or a low-power solid-state amplifier driven into compression.

* * * * *